United States Patent [19]

Rich

[11] Patent Number: 5,207,465
[45] Date of Patent: May 4, 1993

[54] SELF-REALIGNING VACUUM PICKUP ARRANGEMENT

[76] Inventor: Donald S. Rich, 15 Buttonwood Dr., Long Valley, N.J. 07853

[21] Appl. No.: 781,310

[22] Filed: Oct. 24, 1991

[51] Int. Cl.⁵ .......................... B66C 1/02; H05K 3/32
[52] U.S. Cl. ...................................... 294/2; 294/64.1; 29/743
[58] Field of Search ...................... 294/2, 64.1; 901/40; 29/743

[56] References Cited

U.S. PATENT DOCUMENTS

| | | | |
|---|---|---|---|
| 4,381,601 | 5/1983 | Tamai et al. | 29/743 X |
| 4,557,514 | 12/1985 | Cushman et al. | 901/40 X |
| 4,558,755 | 12/1985 | Lundin | 294/64.1 X |
| 4,749,219 | 6/1988 | Bolle, Jr. et al. | 294/64.1 |
| 4,852,247 | 8/1989 | Hawkshell | 294/2 X |
| 4,887,351 | 12/1989 | Porterfield et al. | 294/2 X |

FOREIGN PATENT DOCUMENTS

| | | | |
|---|---|---|---|
| 1038221 | 8/1983 | U.S.S.R. | 294/64.1 |
| 1407802 | 7/1988 | U.S.S.R. | 901/40 |
| 1109152 | 4/1968 | United Kingdom | 294/64.1 |

Primary Examiner—Russell D. Stormer
Assistant Examiner—Dean J. Kramer
Attorney, Agent, or Firm—Rohm & Monsanto

[57] ABSTRACT

A vacuum pickup arrangement, particularly for a pick and place system for automated testing of integrated circuits, employs a resilient, bellows-like retractable device for making a secure vacuum-tight engagement with the integrated circuit specimen. The creation of the vacuum-tight engagement causes axial collapse of the bellows-like arrangement whereby the specimen is brought into communication with one or more protuberances or edges which define a predetermined angular orientation of the integrated circuit specimen desired to be achieved. Laterally disposed alignment jaws are employed to align the integrated circuit specimen with a test socket at a remote location. However, when the specimen is returned, the resilient nature of the bellows automatically realigns the integrated circuit specimen with the location at which it was originally picked up.

4 Claims, 2 Drawing Sheets

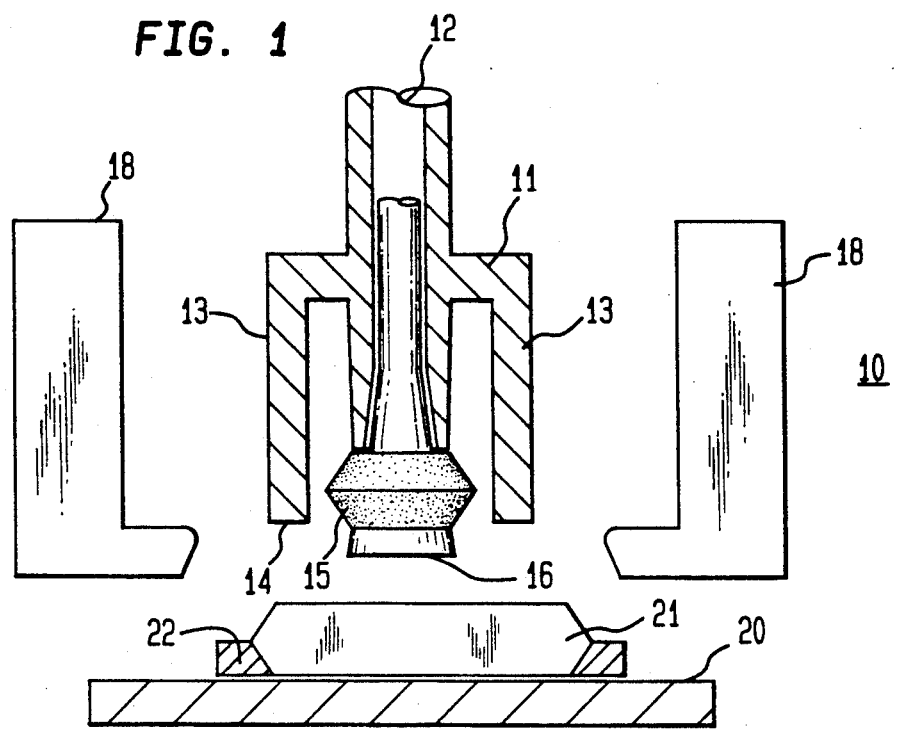
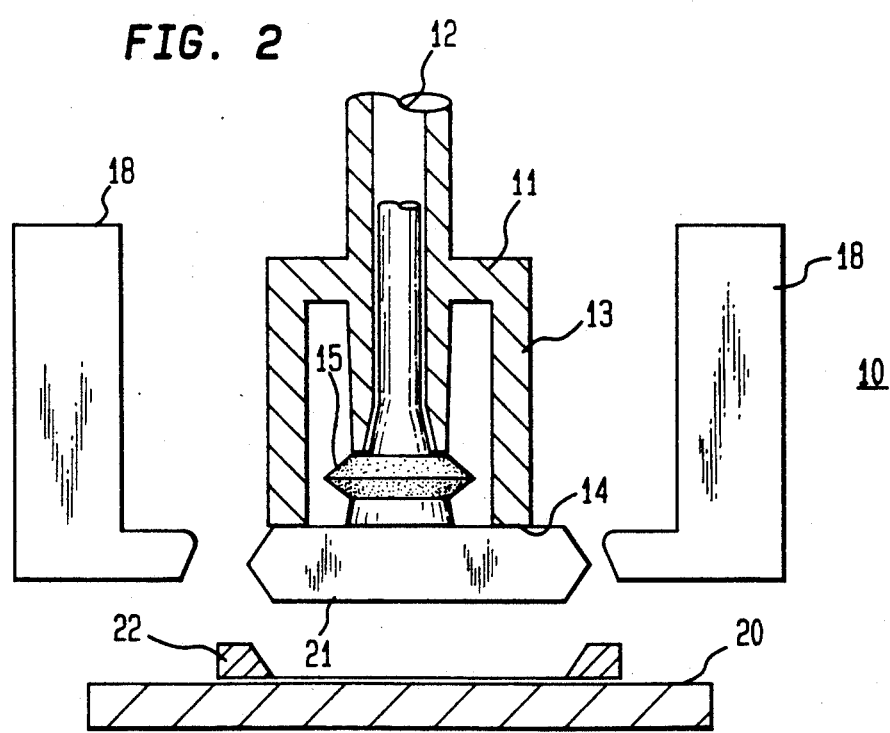

SELF-REALIGNING VACUUM PICKUP ARRANGEMENT

BACKGROUND OF THE INVENTION

This invention relates generally to vacuum pickup heads, and more particularly to a vacuum pickup head which automatically aligns specimens, such as integrated circuit chips, in predetermined planar orientation and x-y displacement, and returns the specimen to its original orientation and location upon release thereof.

There exist a number of problems with pick and place units, such as those which are used to pick up integrated circuits at a first location and transport same to a second location, illustratively a test socket site. Generally, the integrated circuits are arranged on one or more trays which usually are formed of a conductive plastic material. However, the plastic trays are subject to distortion, such as warpage, which causes the integrated circuit chips thereon to be arranged at various angular orientations with respect to a horizontal plane. Such non-horizontal orientations reduces the probability that a vacuum-tight engagement will occur between a conventional vacuum pickup head and the integrated circuit thereby resulting in chips not being picked up, chips being dropped, machine jamming, and generally a reduction in throughput.

In addition to the foregoing, there is a need to displace an integrated circuit chip, once it is picked up, such that it can be deposited accurately at a predetermined location after transportation. In the case where the predetermined location contains a test socket which has very small tolerances, illustratively on the order to thousandths of an inch, it is crucial that the chip be precisely aligned to avoid bending of the electrical leads. If it is desired, after testing, to return the chip to the tray from which it was picked up, or some other tray, the chip, having been displaced to achieve the precise alignment with the test socket, will not be returned to the precise original location, resulting in chips being misplaced on the tray. Again, this would require intervention by a human operator, raising operating costs and reducing net throughput.

It is, therefore, an object of this invention to provide a vacuum pickup arrangement which achieves a reliable vacuum engagement with specimens which are not precisely in planar registration with one another.

It is another object of this invention to provide a vacuum pickup head which maintains vacuum engagement with a specimen, not withstanding that the specimen is displaced in the x and/or y direction to achieve a precise orientation at a location to which the specimen is transported.

It is also an object of this invention to provide a vacuum pickup arrangement which, after a picked up specimen is displaced laterally, restores the specimen to its original location where it was originally picked up.

SUMMARY OF THE INVENTION

The foregoing and other objects are achieved by this invention which provides a vacuum pickup arrangement for engaging a specimen at a pickup location, and holding the specimen during transportation of the specimen to a first deposit location, In accordance with the invention, there is provided an angular alignment device for communicating with the specimen and ensuring that the specimen is held by the vacuum pickup arrangement in a predetermined plane of alignment. Additionally, there is provided an axially retractable vacuum engagement device having a vacuum input for receiving a vacuum and an axially retractable portion for communicating with and engaging the specimen. The retractable portion extends axially beyond the alignment device for a predetermined distance, and is retractable by at least that same distance until the specimen communicates with the alignment device. Upon achieving such communication with the alignment device, the specimen is securely maintained in a precise plane of alignment.

In a preferred embodiment of the invention, the axially retractable vacuum engagement device is provided with a resilient communication portion, illustratively at a working end thereof, for forming a vacuum-tight engagement with the specimen. In one embodiment, the axially retractable portion is formed of a collapsible member for retracting axially in response to the formation of the vacuum-tight seal between the axially retractable vacuum engagement device and the specimen. Preferably, the collapsible member is itself formed of a resilient material, and may have included therewith a bellows portion, which facilitates the retraction.

Once the specimen has been brought into communication with the alignment apparatus, one or more alignment jaws arranged on opposing sides of the axially retractable vacuum engagement device communicate with the specimen and displace same within the plane of alignment. Thus, in embodiments where the specimen is arranged horizontally, and the vacuum pickup arrangement engages the top of the specimen, the alignment jaws displace the specimen horizontally within the plane of alignment and with respect to the angular alignment device.

In some embodiments of the invention, the axially retractable vacuum engagement device is contained within the angular alignment device. In such an embodiment, the maximum displacement of the specimen within the plane of alignment is responsive to the distance between the angular alignment device and the axially retractable vacuum engagement device.

BRIEF DESCRIPTION OF THE DRAWING

Comprehension of the invention is facilitated by reading the following detailed description, in conjunction with the annexed drawing, in which:

FIG. 1 is a partially cross-sectional plan view of a vacuum pickup arrangement constructed in accordance with the principles of the invention, arranged over a specimen, prior to engaging with same;

FIG. 2 is a partially cross-sectional representation of the embodiment of FIG. 1 after the specimen has been picked up and is in communication with the angular alignment device.

DETAILED DESCRIPTION

Figure 3:
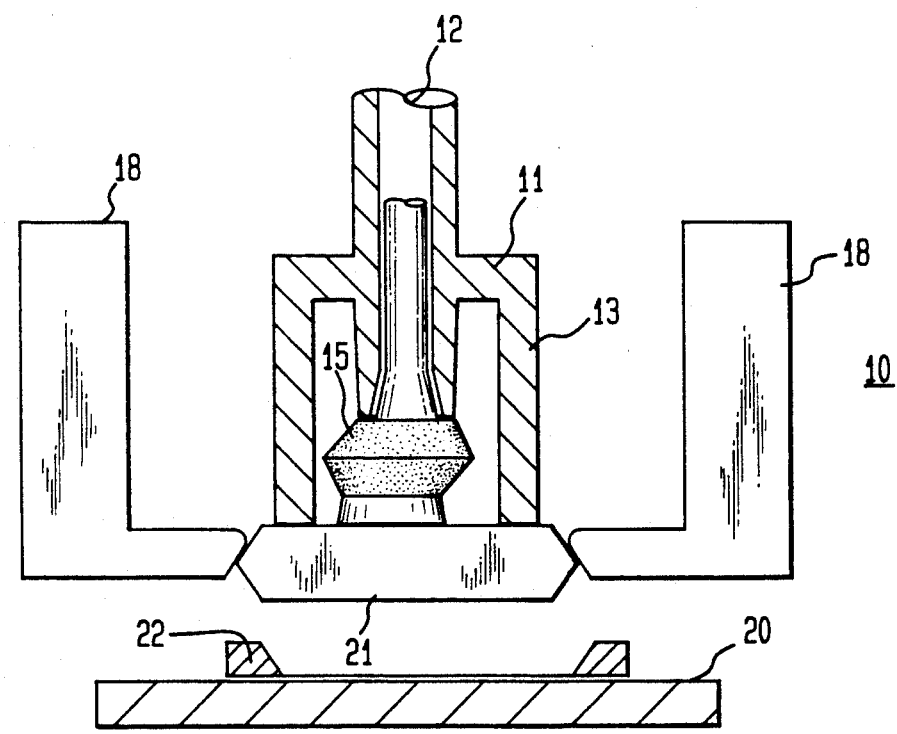
FIG. 3 is a partially cross-sectional representation of the embodiment of FIG. 1 showing the axially retractable vacuum engagement device distorted after the specimen is displaced along the x direction by operation of alignment jaws.

FIG. 1 is a partially cross-sectional, simplified, partially schematic plane view of a pickup head arrangement 10. In this embodiment, an angular alignment device, which may be in the form of a vacuum chuck 11 is provided with a vacuum coupling portion 12 for coupling to a vacuum supply (not shown). The vacuum supply may be controlled to apply a vacuum only during selected portion of the specimen pickup cycle, as will be noted herein. In the cycle point of the pickup head arrangement shown in FIG. 1, the vacuum may be discontinued until communication with the specimen is achieved.

Vacuum chuck 11 is provided with one or more sidewalls 13 which terminate at respective edges 14. The edges, in this embodiment, define a horizontal plane.

In this embodiment, a resilient retractable device 15 is contained within vacuum chuck 11, and is provided with an outer edge portion 16 which is formed of a resilient material, such as a rubber, for ensuring a vacuum-tight engagement with a specimen. The resilient retractable device is shown to have a bellows-like configuration and is coupled to vacuum coupling portion 12 for receiving a vacuum. Pickup head arrangement 12 is further provided with a pair of alignment jaws 18, the function of which will be described below.

FIG. 1 additionally shows a platen 20 which supports thereon a specimen 21 deposited in a tray 22. In some embodiment of the invention, platen 20 is movable so that specimen 21, which may be one of a plurality of specimens contained in tray 22 is disposed directly underneath pickup head arrangement 10. In other embodiments of the invention, the pickup head arrangement is moved over the specimen. Once over the specimen, the pickup head arrangement is lowered so that outer edge portion 16 of the resilient retractable device 15 communicates with the upper surface of specimen 21. This yields a vacuum-tight engagement whereby the bellows-like portion of the resilient retractable device collapses axially in an upward direction. Such collapsible retraction of resilient retractable device 15 draws the specimen toward edges 14 of the vacuum chuck 11. The specimen is thus precisely arranged with horizontal plane. Of course, other embodiments of the invention can employ angular orientations for the specimen which are different from the horizontal.

FIG. 2 is a representation of the embodiment of FIG. 1, after specimen 21 has been brought into communication with edges 14 of vacuum chuck 11. Of course, vacuum chuck 11 need not be configured in a continuous, vacuum-tight manner, and also edges 14 need not form a vacuum-tight engagement with specimen 21. In this specific illustrative embodiment, the vacuum engagement is maintained between the specimen and the resilient retractable device, and therefore, vacuum chuck 11 need not be a vacuum chuck, but may instead by but a plurality of protuberances which serve to ensure that the specimen achieves the predetermined angular orientation. As stated, in this embodiment, the angular orientation is precisely horizontal, but the invention is not limited to this specific angular orientation.

It is seen in FIG. 2 that specimen 21 is off-center with respect to pickup head arrangement 10, yet it is disposed immediately over its tray position. It is an advantageous characteristic of the present invention that, as will be shown below, precise alignment between the pickup head arrangement and the chip locations on the tray is not required.

FIG. 3 shows alignment jaws 18 drawn inwardly toward vacuum chuck 11, whereby the specimen is centered thereon. Note, however, that resilient device 15, particularly its outer edge portion 16, remains in communication with specimen 21 at the same place where engagement was originally made, and therefore the resilient retractable device is shown to be distorted to the left. Thus, the specimen is transported to a second location (not shown) while the specimen is precisely aligned with the vacuum chuck.

It is a particular advantage of the present invention that, when the specimen is returned to the tray 22, the alignment jaws are moved outwardly, thereby laterally releasing the specimen. The resilient nature of the resilient retractable device restores the specimen to the position shown in FIG. 2, such that the specimen is then released directly over the appropriate opening on tray 22. This invention, therefore, not only greatly improves that reliability of the vacuum engagement between the pickup head arrangement and the specimen, but also greatly improves alignment of the specimen as may be required to achieve the objective after the specimen is transported to the second location (not shown), and the specimen is returned to the precise location from which it was picked up.

Although the invention has been described in terms of specific embodiments and applications, persons skilled in the art can, in light of this teaching, generate additional embodiments without exceeding the scope or departing from the spirit of the claimed invention. Accordingly, it is to be understood that the drawing and description in this disclosure are proffered to facilitate comprehension of the invention, and should not be construed to limit the scope thereof.

What is claimed is:

1. A vacuum pickup arrangement for engaging a specimen having a top surface and located at a pickup location and for holding the specimen upon the application of a reduced pressure to the top surface of the specimen during transportation of the specimen to a first deposit location, and during return of the specimen to the pickup location, the arrangement comprising:

angular alignment means having a communication surface for communicating with the specimen and ensuring that the specimen is held by the vacuum pickup arrangement in a predetermined plane of alignment, said communication surface defining said predetermined plane of alignment and being arranged to permit the specimen to be translated along said communication surface in a direction parallel thereto;

axially retractable vacuum engagement means having a laterally stationary vacuum input for receiving a reduced air pressure and an axially retractable portion for communicating with and engaging the specimen, said axially retractable portion having a collapsible bellows portion coupled to said vacuum input and formed of a resilient material with a resilient communication portion for forming an airtight engagement with the top surface of the specimen, said resilient communication portion being resiliently deformable with respect to said angular alignment means and extendable axially beyond said communication surface of said angular alignment means for a predetermined distance so as to communicate with and engage said top surface of said specimen, and being retractable by at least the predetermined distance, until the top of the specimen communicates with said communication surface of said angular alignment means; and lateral alignment means having engaged and unengaged states, said lateral alignment means entering said engaged state for communicating laterally with the specimen and translating same from an untranslated position to a laterally translated position with respect to said communication surface in the plane of alignment while said axially retractable vacuum engagement means is retracted and said communication surface is engaged with the specimen, said collapsible bellows portion being resiliently deformed in response to said translation, and retaining the specimen in said translated position during transportation of the specimen to the first deposit location, said lateral alignment means entering said unengaged state during return of the specimen to said pick-up location for releasing the specimen, whereby the specimen is returned to said untranslated position in response to a lateral restoration force responsive to said resilient deformation of said collapsible bellows portion.

2. The vacuum pickup arrangement of claim 1 wherein said lateral alignment means comprises a pair of alignment jaws arranged on opposing sides of said axially retractable vacuum engagement means for communicating with the specimen and translating the specimen within said predetermined plane of alignment defined by said communication surface with respect to said communication surface.

3. The vacuum pickup arrangement of claim 1 wherein a maximum displacement of the specimen within said predetermined plane of alignment is responsive to a maximum distance of resilient deformation of said bellows portion of said axially retractable vacuum engagement means.

4. The vacuum pickup arrangement of claim 1 wherein said communication surface of said angular alignment means is arranged to surround said bellows portion of said axially retractable vacuum engagement means.

* * * * *